United States Patent [19]

Fujita et al.

[11] 4,336,551
[45] Jun. 22, 1982

[54] THICK-FILM PRINTED CIRCUIT BOARD AND METHOD FOR PRODUCING THE SAME

[75] Inventors: Tsuyoshi Fujita; Tomio Yokoyama; Ichiro Ishi, all of Yokohama, Japan

[73] Assignee: Hitachi, Ltd., Tokyo, Japan

[21] Appl. No.: 165,333

[22] Filed: Jul. 2, 1980

Related U.S. Application Data

[63] Continuation of Ser. No. 909,941, May 26, 1978, abandoned.

[30] Foreign Application Priority Data

May 30, 1977 [JP]   Japan .................................. 52-62125

[51] Int. Cl.³ ..................... H01L 39/02; H01L 23/48; H01L 29/44
[52] U.S. Cl. ........................................ 357/80; 357/68; 357/65; 357/69; 174/52 R; 174/68.5
[58] Field of Search ....................... 357/68, 69, 67, 80, 357/65; 174/52 FP, 68.5

[56] References Cited

U.S. PATENT DOCUMENTS

| | | | |
|---|---|---|---|
| 2,426,252 | 2/1949 | Lepselter | 357/69 |
| 3,303,265 | 2/1967 | Noren et al. | 357/80 |
| 3,404,215 | 10/1968 | Burks et al. | 174/52 FP |
| 3,483,308 | 12/1969 | Wakely | 357/80 |
| 3,591,839 | 7/1971 | Evans | 357/80 |
| 3,716,907 | 2/1973 | Anderson | 357/68 |
| 3,772,575 | 11/1973 | Hegarty et al. | 357/71 |
| 4,048,438 | 9/1977 | Zimmerman | 357/70 |
| 4,136,351 | 1/1979 | Sugawara et al. | 357/68 |

OTHER PUBLICATIONS

RCA Technical Notes; Integration Techniques for Electronically Active Elements and Circuits; by Hui; Jun. 1967.

*Primary Examiner*—Andrew J. James
*Attorney, Agent, or Firm*—Craig and Antonelli

[57] ABSTRACT

A thick-film printed circuit board and a method for producing the same are disclosed, in which wiring conductors having connecting sections for connection with solder electrodes of an electronic element such as a semiconductor chip are provided on an insulating substrate. A layer of insulating material having through holes at positions corresponding to the connecting terminals of the electronic element is covered on the wiring conductors. Conductor pedestals for connection with the electronic element are filled in the through holes and formed on the insulating layer. Each of the pedestals has an area for contact with the connecting terminals of the electronic element.

5 Claims, 10 Drawing Figures

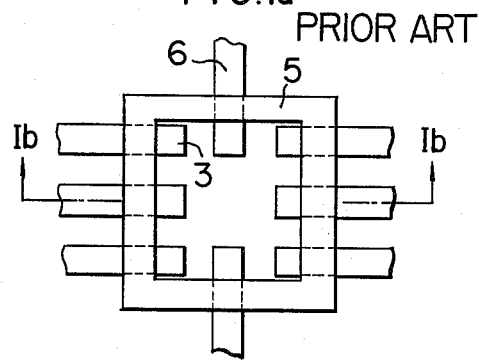
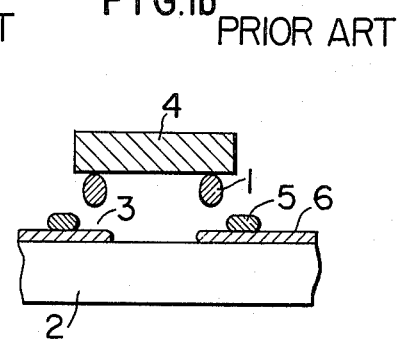
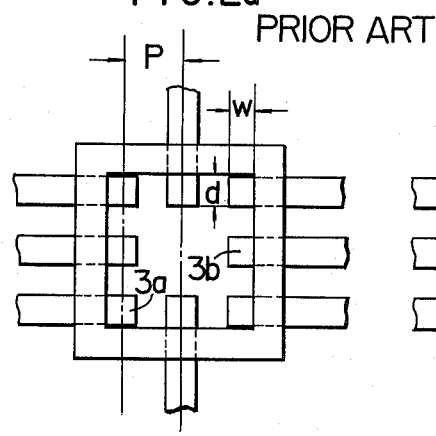
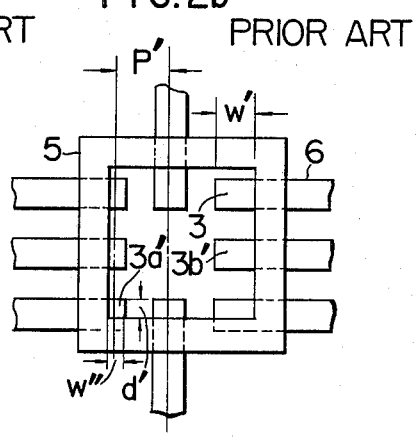
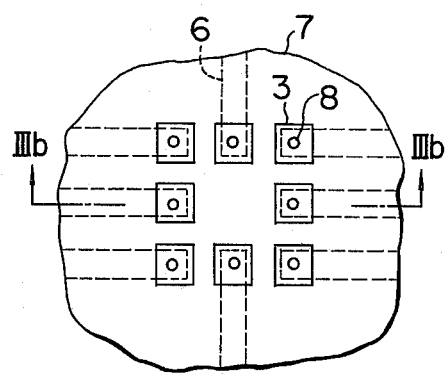
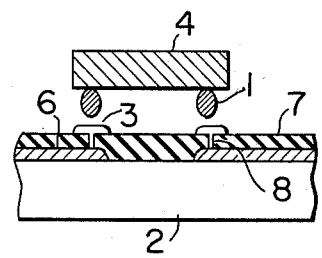

THICK-FILM PRINTED CIRCUIT BOARD AND METHOD FOR PRODUCING THE SAME

This is a continuation of application Ser. No. 909,941, filed May 26, 1978 now abandoned.

LIST OF PRIOR ART REFERENCES (37 CFR 1.56 (a))

The following references are cited to show the state of the art:
1. U.S. Pat. No. 4,023,197
2. U.S. Pat. No. 4,021,838
3. U.S. Pat. No. 3,868,724

BACKGROUND OF THE INVENTION

This invention relates to a thick-film printed circuit board and a method for producing the same, the surface of which has a plurality of connecting conductor portions for enabling highly-accurate positioning of a passive or active element to be mounted on the printed circuit board.

In the conventional thick-film wiring plates to be connected with an electric element, a plurality of wiring conductors are laid on an insulating substrate and an end of each of the conductors constitutes a pedestal to be connected with a solder electrode of the electronic element.

A conventional thick-film printed circuit board will be briefly described below. A basic structure of connecting sections of a conventional thick-film printed circuit board for connection with an electronic element is shown in FIGS. 1a and 1b, which are respectively a plan view and a sectional view taken in line Ib—Ib in FIG. 1a, each illustrating the positional relation with a semiconductor chip making up an active electronic element. As seen from FIG. 1b, the semiconductor chip 4 is provided with ball-shaped solder electrodes 1. After the solder electrodes 1 are positioned on the pedestals 3 forming an essential part of the connecting sections of the thick-film printed circuit board 2 for connection with the electronic element, solder is remelted, thereby connecting the solder electrodes 1 and the pedestals 3 for connection with the electronic element 4. This process is called "solder reflow bonding" and finds practical application as a technique for connecting various elements to a thick-film printed circuit board in view of the availability of simultaneous connection of a multiplicity of connecting sections. In the thick-film printed circuit board using this technique, a construction is required in which solder electrodes 1 are prevented from flowing out and attaching to the other wires 6 at the time of remelting the solder. For this purpose, solder-blocking banks or dams 5 are formed surrounding the connecting pedestals for connection with the electronic element 4, thus securing the desired pedestal area.

In a conventional thick-film printed circuit boards produced by the screen printing process, the solder flow-blocking banks 5 and the wiring conductors 6 are formed by printing through different screens, and the resulting limitative conditions for manufacture pose the problem of a positioning error. Especially in recent years when more and more compact and detailed patterns of printed circuit boards are required, it has been difficult to achieve a sufficiently high dimensional accuracy of the pedestals, leading to a serious problem of a reduced yield. Ideally, as shown in FIG. 2a, substantially no positioning error occurs when the solder flow-blocking banks 5 are formed by screen printing. Actually, however, as shown in FIG. 2b, a positioning error occurs so that the pedestal 3a is reduced in width from w to w" and in length from d to d', while the pedestal 3b increases in width from w to w'. As a result, the pedestal 3a' is reduced in simple mechanical strength as compared with the pedestal 3a shown in FIG. 2a, while the pedestal 3b', is decreased in the connecting strength as compared with the pedestal 3b by the release of residual stress.

Further, while in the case of FIG. 2a, the solder poles are arranged substantially vertically, the solder poles in FIG. 2b have different heights and thicknesses, thereby presenting the danger of short-circuiting between adjacent solder poles. Also, the center distance between pedestals changes from P to P', probably displacing the connecting centers, with the result that residual strain attributable to the inclined fixing of the electronic element causes a reduced connecting strength due to thermal fatigue.

SUMMARY OF THE INVENTION

Accordingly, it is an object of the present invention to provide a thick-film printed circuit board meeting the demand for compactness and having a sufficiently high positioning and dimensional accuracy of the connecting sections thereof for connection with an electronic element.

In order to achieve the above-mentioned object, according to the present invention, there is provided a thick-film printed circuit board and a method for producing the same, in which the connecting sections of the printed circuit board for connection with the electronic element include wiring conductors constituting part of the connecting sections, and an insulating layer covering the wiring conductors and having through holes at positions corresponding to the connecting sections for connection with the electronic element. Further, pedestals for connection with the electronic element are provided at the positions of the through holes for electric connection between the wiring conductors and the electronic element, and the surface area of the pedestals is adjusted, thereby improving the positioning accuracy of the electronic element.

BRIEF DESCRIPTION OF THE DRAWINGS

FIGS. 1a and 1b are diagrams for explaining the structure of the connecting sections of a conventional thick-film printed circuit board for connection with an electronic element, in which FIG. 1a shows a top plan view thereof, and FIG. 1b a sectional view taken in line Ib—Ib in FIG. 1a for explaining the positional relation between the semiconductor chip constituting the electronic element and the printed circuit board to be connected thereto.

FIGS. 2a and 2b are diagrams for explaining a positioning error occurring between the electronic element and the connecting sections of a conventional thick-film printed circuit board at the time of connection with the electronic element, in which FIG. 2a shows a case substantially free from a positioning error and FIG. 2b a case having a large positioning error.

FIGS. 3a and 3b are diagrams for explaining the construction of the connecting sections of a thick-film printed circuit board according to the present invention for connection with an electronic element, in which FIG. 3a shows a top plan view, and FIG. 3b a sectional view taken in line IIIb—IIIb in FIG. 3a showing the positional relation between the semiconductor chip making up the electronic element and the printed circuit board to be connected therewith.

FIGS. 4a and 4b are diagrams for explaining the effect of the positioning error occurring between the electronic element and the connecting sections of the thick-film printed circuit board according to the present invention for connection with the electronic element, in which FIG. 4a shows a case substantially free from an error and FIG. 4b a case involving a large positioning error.

DESCRIPTION OF THE PREFERRED EMBODIMENTS

Figure 4A:
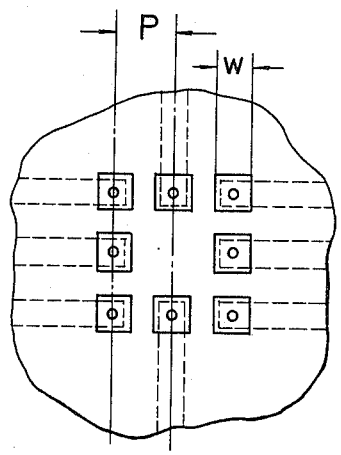

Embodiments of the thick-film printed circuit board according to the present invention will be described with reference to the accompanying drawings.

The diagrams of FIGS. 3a and 3b are for explaining the structure of the connecting sections of the thick-film printed circuit board according to the present invention for connection with the electronic element, in which FIG. 3a is a top plan view and FIG. 3b a sectional view taken in line IIIb—IIIb for explaining the positional relation between the semiconductor chip making up the electronic element and the printed circuit board.

As seen from FIG. 3b, an alumina ($Al_2O_3$) ceramic substrate 2 making up the base of the thick-film printed circuit plate carries wiring conductors 6 of Ag-Pd conductor paste arranged according to the purpose involved. The wiring conductors 6 are covered by an insulating layer 7 of crystallized glass having through holes 8 at positions corresponding to the connecting sections of the wiring plate for connection with the solder electrodes 1 of the semiconductor chip 4. The insulating layer 7 has a function similar to that of the solder flow-blocking banks 5 provided in the prior art as described above with reference to FIGS. 1a and 1b, and has a property hard to be wetted by solder. On the insulating layer 7 are provided connecting pedestals 3 made of Ag-Pd conductor paste each having a predetermined thickness and area and part thereof connected by way of the through holes to the wiring conductors 6. According to this first embodiment of the thick-film printed circuit board according to the invention, the solder electrodes 1 of the semiconductor chip 4 are thus connected electrically with the pedestals 3.

A method of fabricating the thick-film printed circuit board according to the embodiment under consideration will be described briefly below. First, silver-palladium conductor paste is printed by the well-known screen printing process, thereby forming the printed wiring conductors 6 of the desired shape on a sintered alumina ($Al_2O_3$) ceramic substrate, and dried for about seven minutes at 100° C. to 150° C. in a forced air convection environment. Then the assembly is fired for about ten minutes at the temperature of about 800° C. in a forced air convection environment. Next, the whole surface of the semi-finished substrate is covered by paste of an insulating material derived from glass, by the screen printing process as in the fabrication of the wiring conductors 6, thereby producing the layer 7 of insulating material. In the screen printing process, a specific mask is used to form the through holes 8 to be filled with part of pedestals 3 at those positions of the insulating layer 7 where the connecting terminals of the Ag-Pd wiring conductors are located for connection with the connecting portions of the semiconductor chip 4 constituting the electronic element. It is assumed here that the wiring conductors 6 are 200$\mu$ wide, and 20$\mu$ thick, the insulating layer 7 is 20$\mu$ thick, and the through holes 50 $\mu\phi$ in diameter.

The insulating glass paste used in this embodiment is mainly composed of well-known $Al_2O_3$, silica ($SiO_2$), barium oxide (BaO) and calcium oxide (CaO). This insulating glass paste is made of crystallized glass containing titanium oxide ($TiO_2$) as an additive for forming crystal nuclei and has a low wettability to solder. The substrate covered by the insulating layer 7 of the insulating glass paste is dried for ten minutes or less at 100° C. to 150° C. in a forced air convection environment and then fired for about ten minutes at about 800° C. in, say, a forced air convection environment under the conditions in which the insulating glass paste is to be transformed into crystallized glass. As a result, a crystallized glass layer is formed substantially over the entire surface of the substrate except at positions where the conductor layer is exposed by way of the through holes 8.

Next, Ag-Pd conductor paste is printed by the screen printing process on the through holes 8 over the insulating layer 7, thereby producing pedestals 3 each 200$\mu$ by 200$\mu$ in size for connection with the electronic element. In this process, the Ag-Pd conductor paste is filled in the through holes 8 formed in the preceding step. Next, steps similar to those taken for forming the Ag-Pd wiring conductors are taken under similar conditions. In other words, the assembly is dried for about seven minutes at 100° to 150° C. in a forced air convection environment, followed by firing for about ten minutes at about 800° C. in a forced air convection environment, thereby completing the thick-film printed circuit board according to the present invention.

The foregoing description concerns a method for producing the thick-film printed circuit board requiring an ordinary dimensional accuracy, which is called a drying process as against a green-sheet process hereinafter described. Another embodiment of the invention employing a green-sheet process suitable for producing the thick-film printed circuit board requiring a higher dimensional accuracy will be described below. Conductor paste containing W, Mo or Mo-Mn particles with high melting point maintained in contact with each other is printed by the well-known screen printing process on the $Al_2O_3$ green sheet (unsintered plate) constituting the substrate of the thick-film printed circuit board, thereby producing the wiring conductors 6 of the predetermined shape. The assembly is then dried by being left for about 10 minutes in a forced air convection environment in a dryer device set at the drying temperature of 40° to 60° C.

Next, $Al_2O_3$ paste with $Al_2O_3$ as a main component having the same composition as the $Al_2O_3$ green sheet is printed over the entire surface of the substrate by the screen printing process in a manner similar to that employed in the first embodiment, thereby producing a paste layer of an insulating material. In this process, through holes 8 for accomodating the pedestals 3 described later are formed at those positions of the insulating layer which correspond to ends of the wiring conductors 6 to provide connection between the solder parts 1 of the semiconductor chip 4 and the wiring conductors 6 already formed and containing metal particles of high melting point. This process is followed by the drying process under the same conditions as the above-mentioned drying process.

Following the drying process, in order to form the pedestals 3 for connection with the electronic element, the conductor paste containing metal particles of high melting point is printed also by the screen printing process at the through holes in the insulating layer, thereby forming the pedestals of predetermined size. In this process, the through holes 8 formed in the preceding step are filled with the conductor paste containing metal particles of high melting point in contact with the wiring conductors 6 previously formed on the substrate. Next, the paste is dried under the same conditions as in the above-mentioned drying process.

After the drying process, the semi-finished thick-film printed circuit board including the Al$_2$O$_3$ green sheet carrying the dried conductor wirings containing metal particles of high melting point, the dried insulative layer of Al$_2$O$_3$, and the dried pedestals containing metal particles of high melting point, is sintered in a reducing atmosphere for about two hours at 1500° to 1650° C. The sintering process is followed by a cooling process, thus completing the thick-film printed circuit board according to the present invention.

The structure of the thick-film printed circuit plate according to the present invention and the two methods of production of the same have been described above. Now, the advantages of the present invention will be described in comparison with the conventional printed circuit board shown in FIGS. 2a and 2b.

Figure 4B:
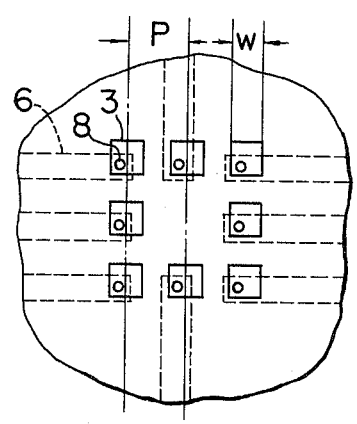

In both the prior art and the present invention, the mask is ideally positioned as shown in FIGS. 2a and 4a respectively. In the worst possible cases, however, the conventional thick-film printed circuit board is such that as shown in FIG. 2b, in printing the solder flow-blocking banks 5 on the substrate by the screen printing process after forming the wiring conductors 6, the positioning error between screen and substrate constitutes the error of pedestal width w and the error of the center distance P between pedestals, thereby making it difficult to obtain pedestals 3 of high accuracy. According to the present invention, on the other hand, if the cross sectional area of the through holes 8 is made sufficiently small as compared with the area of the pedestals 3 to assure that the through holes 8 are located still on the ends of the wiring conductors 6 thereunder even in the case of some displacement of the mask as shown in FIG. 4b, the positioning error between substrate and screen occurring at the time of forming the pedestals 3 is sufficiently absorbed. As a consequence, the pedestal width w and the center distance P between pedestals are determined only by the accuracy of the printing screen pattern without regard to the positioning error of the mask, thus substantially eliminating the disadvantages of the conventional printed circuit boards.

In order to substantiate the improved accuracy, the thick-film printed circuit board according to the present invention has been produced by the first method mentioned above. As a result, it has been noted that the dimensional accuracy of the predestals 3 of the thick-film printed circuit board according to the present invention is 200±15μ which is a sharply improved figure as compared the accuracy of 200±70μ for the conventional printed circuit board. The factors contributing to the dimensional errors in the screen printing process include the transfer error of the printing screen mask and the mask positioning error. The improved accuracy of the structure of the thick-film printed circuit board according to the present invention is attributable to the fact that the mask positioning error may be substantially disregarded.

Figure 5:
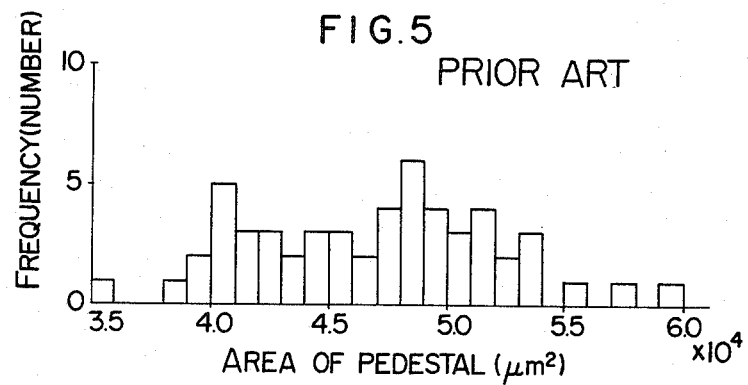
FIG. 5 is a histogram of the distribution of the converted value of pedestal area of the connecting conductors of a conventional thick-film printed circuit board, showing the positioning accuracy thereof.
Figure 6:
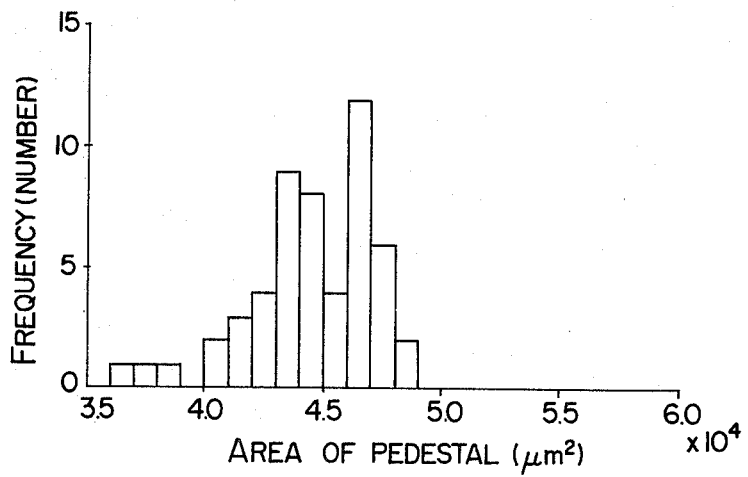
FIG. 6 is a histogram of the distribution of the converted value of area of the connecting pedestals of the thick-film printed circuit board according to the present invention, showing the positioning accuracy thereof.

Now, referring to variations in the area of pedestals 3, the histogram or frequency chart of FIG. 5 shows the distribution of areas of pedestals for the conventional thick-film printed circuit board, and FIG. 6 the distribution of areas of pedestals for the thick-film printed circuit board according to the present invention, both using specimens in the number (N) of 54. Comparison of the two histograms clearly shows that the area of pedestals of the printed circuit board according to the present invention has less variations than that of the prior art.

As described above, the thick-film printed circuit board according to the present invention has pedestals for connection with the electronic element, which is suitable for high-precision positioning and therefore expected to contribute to the development of the thick-film circuits which will find wider applications in the future.

The materials of the insulating layer 7 are not limited to those listed above but may include other substances which can be sintered and is hard to be wetted by solder.

It will also be easily understood from FIG. 2 and other drawings that the insulating layer 7, instead of being laid over the whole surface of the substrate as shown with reference to the above-described embodiments, may be covered only on and in the neighborhood of the ends of the wiring conductors to be connected with the solder electrodes 1 of the electronic element.

We claim:

1. In a thick-film printed circuit board including a substrate of insulating ceramic material and a plurality of wiring conductors on said substrate for direct connection with a semiconductor chip, the improvement comprising a layer of insulating material arranged on said substrate to cover at least the connecting ends of said wiring conductors before connection with said semiconductor chip, said layer being providing with through holes at positions corresponding to said connecting ends of said wiring conductors, and a plurality of conductor pedestals filled in said through holes of said insulating layer and electrically connected with said wiring conductors, each of said conductor pedestals including a part of a predetermined area that extends on said insulating layer, the areas and shapes of said parts of said conductor pedestals being substantially uniform; and each of said through holes having a diameter that is less than the width of the corresponding connecting end of a wiring conductor and having a cross-sectional area that is smaller than said area of the part of the conductor pedestal that extends on said insulating layer so that the through holes compensate for a positioning error that may occur between the formation of said wiring conductors and the formation of said conductor pedestals.

2. A thick-film printed circuit board according to claim 1, in which said pedestals filled in said through holes are made of the same material as that of said wiring conductors.

3. A thick-film printed circuit board according to claim 2, in which said conductor pedestals are made of a thick-film circuit wiring conductor material of precious metal.

4. A thick-film printed circuit board according to claim 2, in which said conductor pedestals are made of a thick-film circuit wiring conductor material of metal of high-melting point.

5. A thick-film printed circuit board according to claim 1, 2, 3 or 4, in which said insulating layer has a surface made of material hardly wetted by solder.

* * * * *